United States Patent [19]

Dahlheimer et al.

[11] Patent Number: 4,618,823
[45] Date of Patent: Oct. 21, 1986

[54] INDUCTIVE PROXIMITY SWITCH HAVING AN OSCILLATOR MAGNETIC CORE AND A PERMANENT MAGNET FORMING A SATURATION-SENSITIVE MAGNETIZATION AREA

[75] Inventors: Peter Dahlheimer, Schalksmuehle; Gerno Soyck, Halver, both of Fed. Rep. of Germany

[73] Assignee: Werner Turck GmbH & Co. KG, Halver, Fed. Rep. of Germany

[21] Appl. No.: 537,536

[22] Filed: Sep. 30, 1983

[30] Foreign Application Priority Data

Sep. 30, 1982 [DE] Fed. Rep. of Germany ....... 3236224

[51] Int. Cl.$^4$ .................. G01B 7/14; H03K 17/95
[52] U.S. Cl. .................................. 324/207; 324/232; 324/236; 331/65; 340/551
[58] Field of Search ............... 324/207, 208, 228–232, 324/236, 237, 173, 174; 340/551, 686; 246/249, 247; 307/116; 331/65; 361/180

[56] References Cited

U.S. PATENT DOCUMENTS

| | | | |
|---|---|---|---|
| 2,226,275 | 12/1940 | Abbott et al. | 324/229 |
| 3,161,387 | 12/1964 | Jutier | 324/232 X |
| 3,405,353 | 10/1968 | Smith et al. | 324/229 |
| 3,922,599 | 11/1975 | Steingroever et al. | 324/232 X |
| 4,045,738 | 8/1977 | Buzzell | 324/208 X |
| 4,384,252 | 5/1983 | Kolter | 324/208 X |

FOREIGN PATENT DOCUMENTS

| | | | |
|---|---|---|---|
| 1047240 | 8/1954 | Fed. Rep. of Germany | 246/249 |
| 1175327 | 8/1964 | Fed. Rep. of Germany | . |
| 1924279 | 6/1975 | Fed. Rep. of Germany | . |
| 2827951 | 2/1980 | Fed. Rep. of Germany | . |
| 2739967 | 6/1981 | Fed. Rep. of Germany | . |
| 2829880 | 10/1981 | Fed. Rep. of Germany | . |
| 1413296 | 8/1965 | France | 246/249 |
| 2425648 | 12/1981 | France | . |

*Primary Examiner*—Gerard R. Strecker
*Attorney, Agent, or Firm*—Antonelli, Terry & Wands

[57] ABSTRACT

An inductive proximity switch including an oscillator a circuit of which has an oscillator magnetic core adapted to be influenced by a trip device for the purpose of actuating an electronic switch. The proximity switch is adapted to detect an approach of the trip device, of a permeable material, through a nonferromagnetic wall so as to enable a triggering of the switching process. A sensor field formed of a magnetic field of a permanent magnet or an electromagnetic, with the proximity switch having a saturation-sensitive magnetization area or region in which the magnetic fluxes of the permanent magnet or electromagnet and oscillator core heterodyne. The inductive proximity switch is adapted to be operated in saturation by a reduction in a magnetic resistance produced by introducing the permeable trip device into the sensor field, damping the oscillator circuit and causing a switching of the electronic switch.

19 Claims, 6 Drawing Figures

INDUCTIVE PROXIMITY SWITCH HAVING AN OSCILLATOR MAGNETIC CORE AND A PERMANENT MAGNET FORMING A SATURATION-SENSITIVE MAGNETIZATION AREA

The present invention relates to a switch and, more particularly, to an inductive proximity switch with a sensor field in front of an active surface thereof for an approaching trip device and including an oscillator, the circuit of which has an oscillator magnetic core adapted to be influenced by the trip device for the purpose of turning an electric switch on and off.

In, for example, German Pat. No. 1,924,279 and 2,827,951, inductive proximity switches are proposed wherein the sensor field is formed by the high frequency field of the oscillator, with energy being tapped from the high frequency field by an immersed metallic trip device thereby resulting in an attenuation of an oscillator circuit and a change in a control potential for the electronic switch.

A disadvantage of the above-noted proposed inductive proximity switches resides in the fact that an activation may not be accomplished through a metal wall such as, for example, a wall of a V2A steel container since the electromagnetic high frequency field does not penetrate the metal wall to such an extent so that there is a damping or detuning of the oscillator circuit of the proximity switch disposed on the other side of the wall through a metal log or similar device.

In Auslegesschrift No. 27, 39 967, a further proximity switch is proposed in which an oscillator circuit of a high frequency oscillator is arranged within a housing in such a manner that metal or other objects only cause an extremely limited damping or detuning of the oscillator circuit, which limited damping or detuning is insufficient to trigger a switching operation. In this proposed arrangement an activation of the switching process is accomplished by an approach of a special oscillator trip circuit which is tuned to the high frequency oscillator thereby ensuring that no switching process may be triggered by foreign objects.

A disadvantage of the last mentioned proposed proximity switch resides in the fact that such switch includes two high frequency oscillators and also, the switch may not be used as a switch adapted to act through a metal wall because the presence of such metal wall causes a disruptive damping and clipping of the high frequency fields on both sides.

In German Pat. No. 2,829,880, an electronic contactless safety switch which includes an oscillator is provided with the safety switch being adapted to be influenced from the outside. More particularly, in this proposed safety switch, a trip device is fashioned as a dish-shaped ferrite core which constitutes a counter part to a ferrite core of the oscillator. A feedback resistance is adjusted in such a manner that the amplitude of the oscillation becomes very small and, if a metal part is introduced into the high frequency field, the oscillations break away in the usual manner and cannot be utilized for generation of a signal. On the other hand, if the ferrite core trip device enters the high frequency field, the amplitude of the oscillation increases so sharply that an output relay responds. As with the previously discussed proposed switches, this switch also cannot be used in instances where a switching operation is to be carried out through a metal wall.

Various other magnetic and electromagnetic devices have been proposed in which an approach of a magnet can be detected through a metal wall and, in particularly, through a non-ferro magnetic metal wall. However, these mechanical devices are structurally complicated, slow in providing a switching action and, in many instances, susceptible to interference.

A magnetic device of the last mentioned type is proposed in, for example, French Application No. 2425 648, with the device being in the form of a magnetic field switch; however, this proposed field switch has a limited measuring sensitivity, requires a relatively large current supply and, consequently, cannot be used, for example, with complicated production equipment having, for example, many hydraulic or pneumatic devices which often have several hundred proximity measuring points. Additionally, from a production stand point, it is extremely difficult and costly to attach permanent magnets to moving parts in a suitable manner because permanent magnets are generally made of a brittle material which is difficult to process.

The aim underlying the present invention essentially resides in providing an inductive proximity switch which is adapted to detect an approach of a triggering device, fashioned of a permeable material, through a non-ferromagnetic metal wall and which is adapted upon such detection to initiate a trigger switching process.

In accordance with advantageous features of the present invention, a sensor field is provided which is formed of a magnetic field of an auxiliary magnet, for example, a permanent magnet or an electromagnet, with the proximity switch having a saturation-senstitive magnetization area formed by magnetic fluxes of a permanent magnet and an oscillator magnet core heterodyne, which is adapted to be operated in saturation by a reduction of a magnetic resistance in a sensor field when a permeable trip device is introduced into the sensor field.

In accordance with the present invention, the sensor field may be influenced only by a magnetized or magnetizable special ferromagnetic material so that a proximity switch may be used, for example, on walls made of, for example, copper, bronze, aluminum or non-magnetizable steel. The sensor field penetrates such a wall and, depending upon the shape and strength of the permanent magnet employed, the field projects to more or less large distances into a space behind the metal wall. The magnetic flux of the permanent magnet is associated with a relatively large magnetic resistance because of a long air distance or distance of limited permeability and, consequently is so limited that the magnetic saturation does not occur in a base state within the magnetization area in which it heterodynes the magnetic flux of the oscillator magnetic core.

The saturation of the heterodyne region is caused by an introduction of the trip device of permeable material such as, for example, ferrite material or a magnetizable steel piece, with the trip device shortening the air gap for the induction lines of the sensor field and thus reducing the magnetic resistance of the sensor field. The resulting increase in the magnetic flux of the permanent magnet forces the heterodyne area into saturation. The oscillator tuned to the base state is so severly damped when the area is saturated that a switching process is triggered in an electronic switch which is controlled from the oscillator.

On advantage of the proximity switch of the present invention resides in the fact that it may be readily utilized to detect motion through nonferromagnetic walls, with the proximity switch responding only to trip devices of a relatively high permeability.

Advantageously, the trip devices may be fashioned as permanent magnets although it is particularly advantageous to utilize normal magnetizable steels for the trip device. The materials for the trip device may be readily worked and installed with relatively little problem in other moving parts.

In accordance with further advantageous features of the present invention, the oscillator of the proximity switch has a minimum current requirement of, for example, 0.1 to 5 miliamperes and is constructed with a very large measuring sensitivity and a relatively large response range.

A further advantage of the present invention resides in the fact that the proximity switch is well suited for monitoring tasks within hot and/or agressive media because the trip device is located in the media while the proximity switch and all of the magnetic and electrical parts are disposed outside of the media and thus can be protected by layers of insulation and/or cooling devices. Additionally, the sensor head formed of the auxiliary magnet, oscillator core, and oscillator coil can be mounted separately from the electronic circuitry and need only be connected to the circuitry by way of electrical lines.

Preferably, in accordance with the present invention, the oscillator magnet core consists of a ferrite dish-shaped core with a center protrusion and a dish wall, with the dish wall being interrupted so as to form a so-called X-core or RM-core of the type described, for example, in German Pat. No. 2,827,951.

The permanent magnet may, in accordance with the present invention, by a cylindrical bar magnet approximately equal in diameter to the ferrite dish-shaped core and have a pole surface which sits on the dish core as a yoke, with the other pole surface constituting the active surface of the proximity switch. With such a construction, the module consisting of the permanent magnet and dish core may be relatively small and, for example, may have a diameter and height of 5–10 mm each.

Alternatively, in accordance with the present invention, the saturation sensitive magnetization area may be located between two permanent magnets switched in magnetic series, with a sensor field being located between the free pole surfaces of the permanent magnets. In such a construction, the attainable measurement sensitivity is particularly high because the permeable trip device can bridge a majority of the air gap of the sensor field so that the magnetic resistance of the sensor field may be reduced very sharply by the trip device.

It is also possible in accordance with the present invention for the magnetization area within the magnetic fluxes of an oscillator magnetic core and permanent magnetic heterodyne to have a narrowed cross section resulting in a particularly high saturation sensitivity at the narrowed portion.

Accordingly, it is an object of the present invention to provide an inductive proximity switch which avoids, by simple means, shortcomings and disadvantages encountered in the prior art.

Another object of the present invention resides in providing an inductive proximity switch which is simple in construction and therefore relatively inexpensive to manufacture.

Yet another object of the present invention resides in providing a proximity switch which readily detects the approach of a triggering device through a non-ferromagnetic metal wall so as to enable a carrying out of a switching process of the inductive switch.

A further object of the present invention resides in providing an inductive proximity switch which is capable of being utilized within a hot and/or unfavorable environment.

These and other objects, features, and advantages of the present invention will become more apparent from the following description when taken in connection with the accompanying drawings which show, for the purpose of illustration only, several embodiments in accordance with the present invention, and wherein.

Figure 1:
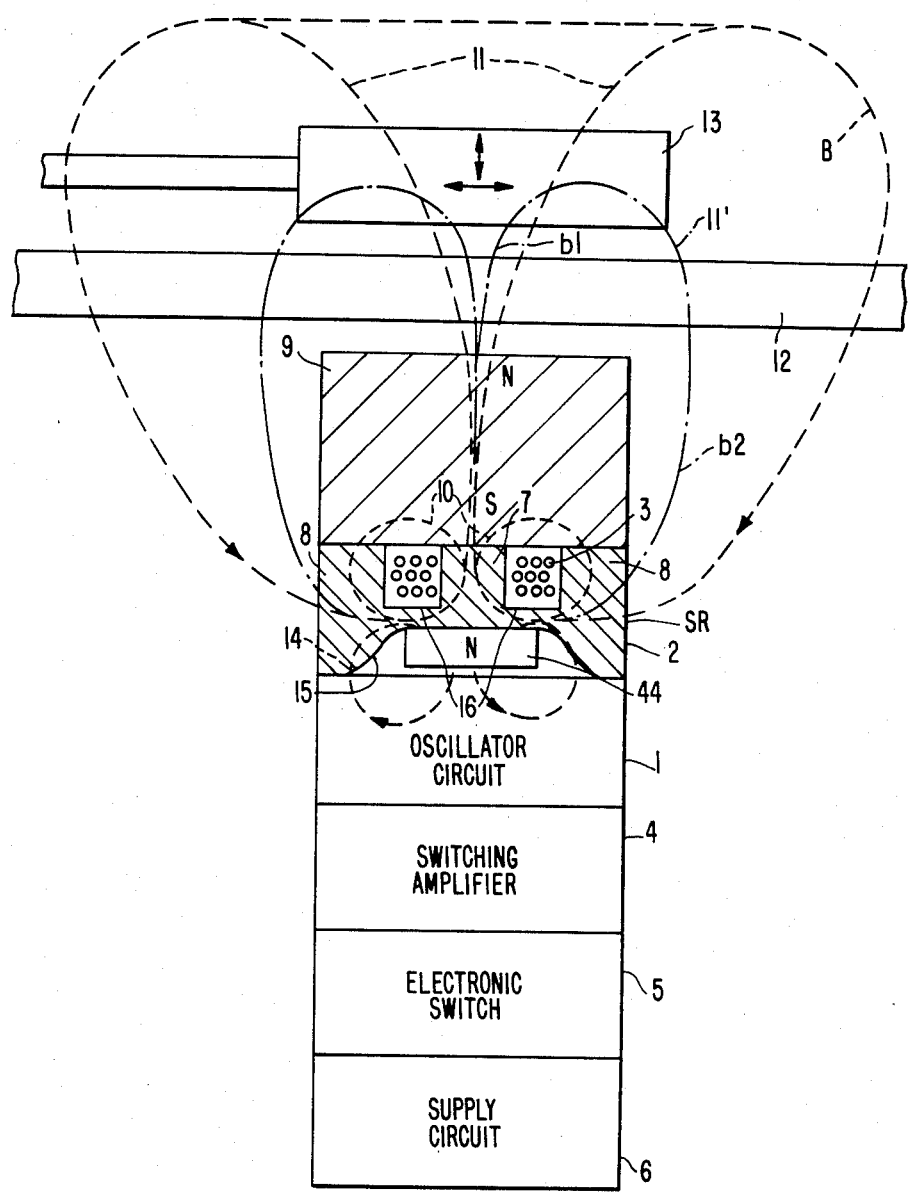
FIG. 1 is a partial cross sectional schematic view of a first embodiment of an inductive proximity switch in accordance with the present invention.

Referring now to the drawings wherein like reference numerals are used throughout the various views to designate like parts and, more particularly, to FIG. 1, according to this Figure, an inductive proximity switch includes, as in conventional proximity switches, an oscillator circuit 1, a pot-shaped magnetic core 2, an oscillator coil 3, a switching amplifier 4, an electronic switch 5 such as, for example, a transistor, or triac, and a supply circuit 6 for producing a supply voltage for the oscillator circuit 1 and switching amplifier 4.

The magnetic core 2 includes a ferrite dish core having a central projection or protrusion 7 and two poles 8 disposed on respective jacket sides of the central protrusion or projection 7. In conventional inductive proximity switches, the high frequency oscillation field which exits at the top of the pot-shaped magnetic core 2 constitutes a sensor field. In the proximity switch of the present invention, a cylindrical permanent magnet 9, of approximately the same diameter as the magnetic core 2, is disposed on the open side thereof, with the permanent magnet 9 representing a short circuit yoke for the pot-shaped magnetic core 2 which limits the high frequency oscillation field, represented by the dotted line 10, to the interior of the magnetic core 2 and the permanent magnet 9.

The permanent magnet 9 also provides a magnetic sensor field 11 on a so-called active surface of the proximity switch, with the sensor field being represented by a dotted line. In FIG. 1, a sensor field 11 has a dynamically balanced shape of a torus and is not influenced by nonferromagnetic materials and may readily penetrate a wall 12 made of, for example, aluminum, nonmagnetizable steel, bronze, copper, etc., without a noticable reaction. However, if a permeable trip device 13 is introduced into the sensor field 11, the introduction of the trip device 13 sharply contracts the sensor field and reduces the mean field line strength thereby sharply reducing the magnetic resistance of the sensor field 11.

As shown in FIG. 1, an original free magnetic field length B, which extends from the N pole of the permanent magnet 9 over a wide arc to the jacket surface SR of the magnetic core, is reduced to a small free magnetic field length b1 between the N pole and an underside of the trip device 13 and a segment b2 between the underside of the trip device 13 and the jacket surface SR of the magnetic core 2 when the trip device 13 is introduced.

As also shown most clearly in FIG. 1, the magnetic flux of the oscillator circuit 1 as well as the magnetic flux of the permanent magnet 9 pass through a base 14 and central projection or protrusion 7 of the magnetic core 2. The cross-section of the base of the pot-shaped magnetic core 2 is sharply reduced in a central area thereof by a lower trough-like recess 15 producing a particularly saturation-sensitive region 16 and a transition point between the center projection 7 and base 14. As can be seen from the drawing, the magnetic fluxes 10, 11 of the two magnetic fluxes heterodyne in this area. When a trip device 13 is introduced, the sensor field 11 is deformed so as to take the form illustrated in the dot and dash line 11', and the magnetic flux of the permanent magnet 9 is so sharply enlarged that a saturation and, thus a sharp damping of the oscillator 1 is produced in the heterodyne region 16, with the damping of the oscillator 1 triggering a switch-over of the electronic switch 5.

Figure 2:
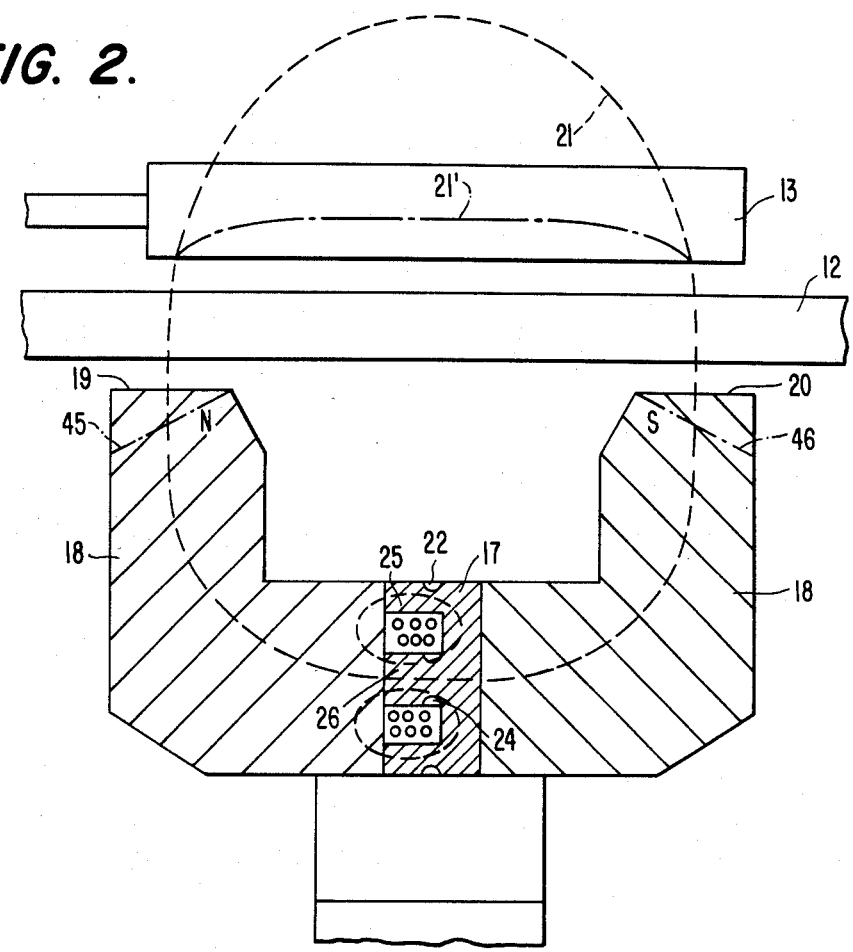
FIG. 2 is a partially schematic cross sectional view of another embodiment of an inductive proximity switch in accordance with the present invention.

As shown in FIG. 2, a pot-shaped magnetic core 17 is framed or surrounded along its axial extent between two L-shaped permanent magnets 18, 18 which are arranged in series and which are combined so as to form a substantially U-shaped configuration. A sensor field 21, having a relatively wide air gap, is disposed between free poles 19, 20 of the L-shaped permanent magnets 18, 18, with the free poles 19, 20 extending and pointing in the same direction. An introduction of the trip device 13 once again traps the sensor fields as indicated by the dot and dash line 21' so that the free air gap is thus shortened to the distance between the free S, N poles and an underside of the trip device 13. The cross section of the pot-shaped magnet core 17 is sharply reduced by a circumferential groove 22 on the jacket and the circumferential groove 24 on the central pole projection again creating a particular saturation-sensitive region 25, 26 over the remaining cross sectional areas. The magnetic flux of the two permanent magnets 18, 18 and the oscillator circuit together flow through the saturation sensitive regions.

Figure 3:
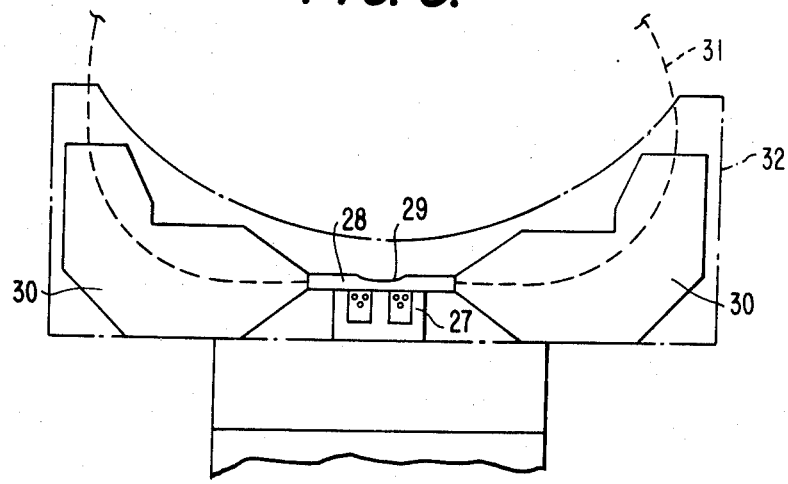
FIG. 3 is a schematic view of a further embodiment of an inductive proximity switch in accordance with the present invention.

As shown in FIG. 3, a pot-shaped magnet core 27 is bridged, on an open side thereof, by a yoke 28 having a cross section which is reduced to form a saturation-sensitive magnetization region 29. The total magnetic flux of the oscillator circuit 1 passes through the saturation sensitive region, and the yoke 28 is located between two series connected approximately L-shaped permanent magnets 30, 30 so that the entire magnetic flux of the sensor field 31 of the permanent magnets 30, 30 likewise pass through the cross sectional constriction of the yoke 28. The two permanent magnets 30, 30, yoke 28, and magnetic core 27 may, for example, be embedded in a cast resin body 32 or a similar body. The arrangement of FIG. 3 is constructed, on a side of the sensor field 31 as a concave cylindrical jacket which may readily be fitted tightly into a pipe or similar device.

As can readily be appreciated, the inductive proximity switch of the present invention may have very small dimensions and, for example, a module of the embodiment of FIG. 1 which includes a magnetic core 2 and a permanent magnet 9 may be constructed in a pellet shape with a diameter and height of, for example, 5 mm.

Figure 4:
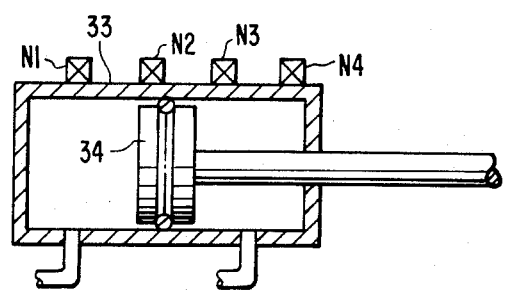
FIG. 4 is a cross sectional view of a piston-cylinder arrangement with four proximity switches constructed in accordance with the present invention located on an outside of the cylinder for enabling a determination of a position of the piston.
Figure 5:
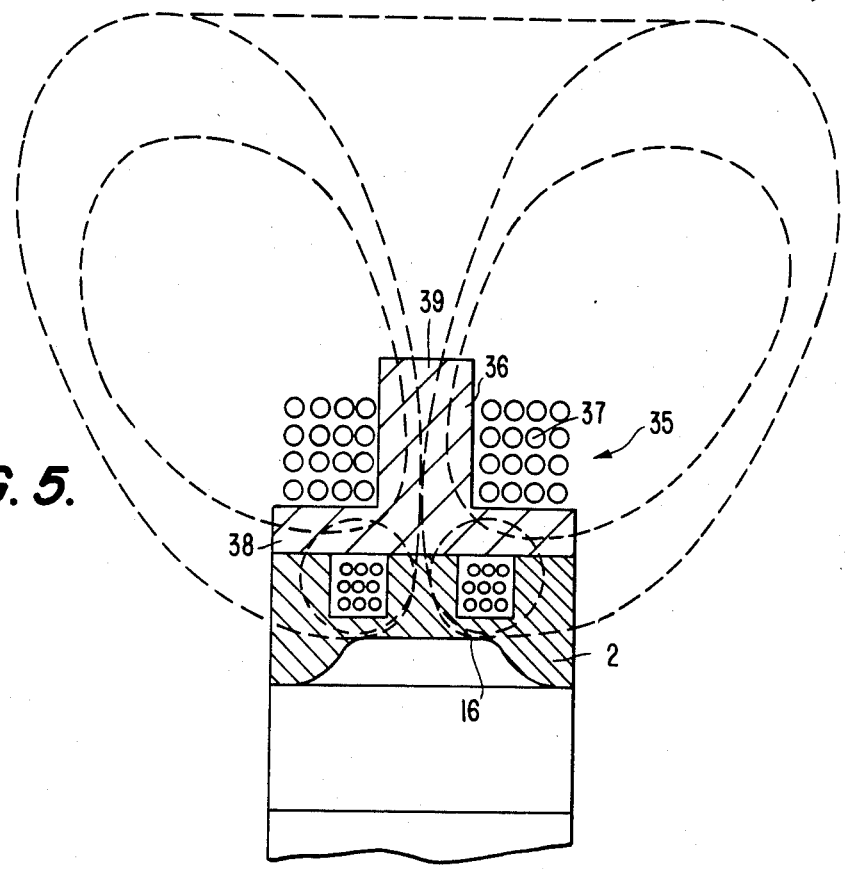
FIG. 5 is a partially schematic cross sectional view of a further embodiment of an inductive proximity switch in accordance with the present invention.

FIG. 5 provides a practical example of the disposition of proximity switches constructed in accordance with the present invention. More particularly, as shown in FIG. 4, four proximity switches N1–N4 are disposed at regular predetermined intervals along an outer wall 33 of a hydraulic cylinder, with the cylinder being fashioned of a non-ferromagnetic material such as, for example, a non-magnetizable steel. The piston 34 of the hydraulic cylinder-piston is fashioned of a ferromagnetic material and, when the piston 34 passes the proximity switches N1–N4 the movement of the piston triggers the switching process of the respective proximity switches N1–N4.

In FIG. 5, auxiliary magnets are provided which are formed of an electromagnet generally designated by the reference numeral 35 which has a dynamically balanced magnetic core 36 having a substantially T-shaped cross section and a coil 37. A plate-shaped portion 38 of the magnetic core 36 rests on a yoke on the oscillator magnetic core 2. A portion of the sensor magnetic field exits through a central projection or protrusion 39 and progresses through a plate-shaped part 38, while a majority of the field passes through the magnetic core 2 and its saturation-sensitive zone 16. The electromagnet 35 may be supplied with either a direct or alternating current, although a low-frequency alternating current is advantageous in that little or no permeable foreign substance can accumulate in front of a frontal surface of the central projection of protrusion 39.

Figure 6:
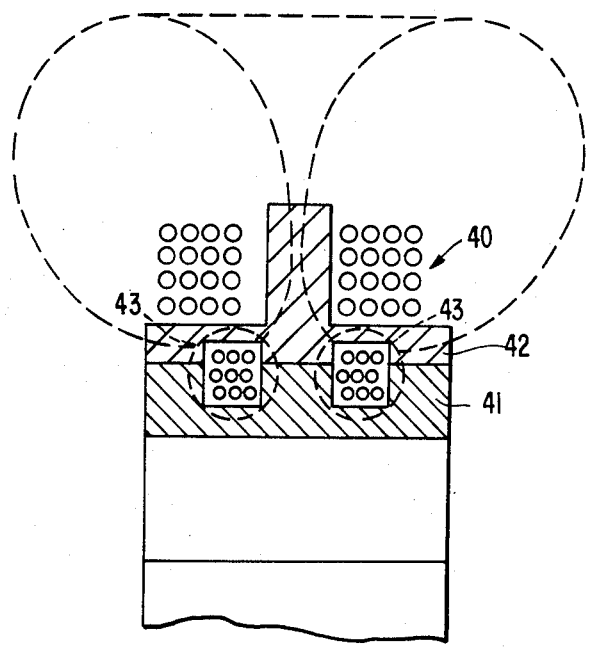
FIG. 6 is a partially schematic cross sectional view of yet another embodiment of an inductive proximity switch constructed in accordance with the present invention.

As shown in FIG. 6, an electromagnetic generally designated by the refernce numeral 40 is once again provided as an auxiliary magnet, with a plate-shaped portion 42 serving as a yoke, and an oscillator magnetic core 41 having an annular or ring-shape and a saturation-sensitive area 43 formed by a tapering of a cross section of the plate-shaped portion 42. In the embodiments of FIGS. 5 and 6, a switching process may be triggered by introducing a permeable body into the sensor magnetic field.

In FIG. 1, a permanent magnet 44 is arranged on an underside of the oscillator magnetic core 2, with the permanent magnet being adapted to premagnetize the magnetic core 2 to such an extent that, during normal operation, it operates just below the saturation turning point of its magnetization performance line, with south poles of the permanent magnets 9 and 44 facing toward one another so that the magnetic flux flows through the saturation sensitive area 16 in the same direction.

Alternatively, as shown in FIG. 2, slanted pole surfaces 45, 46 may be provided, with the surfaces 45, 46 being slanted with respect to one another in such a manner that normal lines of the surfaces 45, 46 diverge. Such an orientation of the pole surfaces 45, 46 result in a magnetic field which is wider than the field represented by the dotted line 21 and, consequently, such field can be "short circuited" more sensitively by a permeable trip device 13.

As described hereinabove, in accordance with the present invention, the magnetic flux of the high frequency oscillation field 10 is completely trapped in ferrite material, i.e., the poles 8, permanent magnet 9, as well as core 27 and yoke 28. At least at one portion of ferrite material is reduced in cross section so as to render the same particularly susceptible to saturation. Moreover, the sensor field is provided by a permanent magnet 9 or electromagnet 35 which is permanently mounted at the oscillator 1 and, in this case, the magnetic flux of the field 11 also flows through the reduced cross-sectional area. The ferromagnetic trigger mechanism or a magnet, the N, S poles of which are oriented in the same manner as those of the permanently mounted magnet 9, amplifies the sensor field 11 and, at the reduced cross-sectional area, causes a state of saturation thereby damping the oscillator 1 which oscillates at a maximum amplitude in the base or initial position and produces a signal. Furthermore, the present invention provides a construction in which the oscillator 1 has two coils, namely, an oscillation coil and a feedback coil which may be physically formed as a unified winding with a common winding.

While we have shown and described several embodiments in accordance with the present invention, it is understood that the same is not limited thereto but is susceptible of numeruous changes and modifications as known to one having ordinary skill in the art and we therefore do not wish to be limited to the details shown and described herein, but intend to cover all such modifications as are encomplassed by the scope of the appended claims.

We claim:

1. An inductive proximity switch comprising oscillator circuit means including an oscillator coil wound on a magnetic core for generating a magnetic field, electronic switch means connected to the oscillator circuit means and adapted to be actuated in dependence upon a damping of the oscillations of the oscillator circuit means, at least one auxiliary magnet having at least one pole surface forming an active surface of the proximity switch and the pole axis of said pole surface being substantially transversely directed with respect to the active surface so that the auxiliary magnet produces a sensor field having flux extending out from the active surface, a trip device fashioned of a permeable material and being moveably supported so as to be movable toward said active surface, and said auxiliary magnet being connected to the magnetic core of said oscillator circuit means so as to form a permeable unit, the flux of said magnetic core of said oscillator circuit means being completely closed by the auxiliary magnet, and wherein said permeable unit has a reduced cross-sectional area in which the magnetic fluxes of the auxiliary magnet and the magnetic core of said oscillator circuit means heterodyne, said reduced cross-sectional area forming a saturation-sensitive magnetization area, said reduced cross sectional area being adapted to be operated in saturation by a reduction in the magnetic resistance in the sensor field which occurs when the trip device is introduced into the sensor field, thereby damping the flux of the magnetic core of said oscillator circuit means.

2. An inductive proximity switch according to claim 1, characterized in that the magnetic core of said oscillator circuit means includes a pot-shaped ferrite dish-shaped core having a central projection and a dish-shaped wall.

3. An inductive proximity switch according to claim 2, characterized in that the auxiliary magnet is a cylindrically shaped permanent bar magnet having a diameter approximately equal to a diameter of the ferrite core, the permanent magnet serving as a yoke and resting on the ferrite core.

4. An inductive proximity switch according to claim 1, characterized in that the auxiliary magnet is formed by two series arranged permanent magnets and the saturation sensitive magnetization area is formed between said two series arranged permanent magnets, the sensor field is defined by pole surfaces of the two permanent magnets and the magnetic core of said oscillator circuit means.

5. An inductive proximity switch according to claim 4, characterized in that the magnetic core of said oscillator circuit means is disposed between the two series arranged permanent magnets.

6. An inductive proximity switch according to claim 5, characterized in that each of the series arranged permanent magnets has a substantially L-shaped cross-sectional configuration and are arranged with the magnetic core of said oscillator circuit means so as to form a substantially U-shape.

7. An inductive proximity switch according to claim 4, characterized in that the magnetic core of said oscillator circuit means is fashioned as a dish-shaped core of a ferrite material, and a yoke means is disposed between the two series arranged permanent magnets for forming a saturation sensitive part.

8. An inductive proximity switch according to claim 1, characterized in that the magnetic core of said oscillator circuit means has a pot-shaped configuration and includes a central projection, and in that the reduced cross sectional area is formed in an area of the projection.

9. An inductive proximity switch according to claim 1, characterized in that the magnetic core of said oscillator circuit means includes a base portion, and in that the reduced cross section for forming the saturation senstive magnetization area is formed in a central area of the base portion.

10. An inductive proximity switch according to claim 1, characterized in that the magnetization area is formed between two permanent magnets, and in that free pole surfaces of the two permanent magnets are inclined with respect to one another such that normal lines extending through the respective surfaces diverge.

11. An inductive proximity switch according to claim 1, characterized in that the magnetic core of said oscillator circuit means is disposed between the auxiliary magnet and a premagnetization permanent magnet, a magnetic flux of the premagnetization permanent magnet passes through the saturation sensitive magnetization area in the same direction as the flux of the auxiliary magnet.

12. An inductive proximity switch according to claim 1, characterized in that the auxiliary magnet is an electromagnet.

13. An inductive proximity switch according to claim 1, characterized in that the magnetic core of said oscillator circuit means has a substantially pot-shaped configuration, the auxiliary magnet is disposed on an open side of said magnetic core and forms a yoke means for limiting a high frequency oscillation field to an interior of the magnetic core and the auxiliary magnet.

14. An inductive proximity switch according to claim 13, characterized in that the auxiliary magnet and magnetic core have substantially the same diameter.

15. An inductive proximity switch according to claim 13, characterized in that a premagnetization magnet is provided, said magnetic core of said oscillator circuit means being interposed between said premagnetization magnet and said auxiliary magnet.

16. An inductive proximity switch according to claim 15, characterized in that the auxiliary magnet is a cylindrical shaped permanent magnet.

17. An inductive proximity switch according to claim 15, characterized in that the auxiliary magnet is an electromagnet.

18. An inductive proximity switch according to claim 1, characterized in that the auxiliary magnet is an electromagnet including a substantially T-shaped core of said oscillator circuit having an coil disposed thereon, the T-shaped core includes a plate shaped portion adapted to rest on the magnetic core means and form a yoke.

19. An inductive proximity switch according to claim 18, characterized in that the magnetic core of said oscillator circuit means is formed as a ferrite body having a higher permeability than the permeability of the core of the electromagnet.

* * * * *